US010163660B2

(12) United States Patent
Langhanoja et al.

(10) Patent No.: US 10,163,660 B2
(45) Date of Patent: Dec. 25, 2018

(54) SENSOR DEVICE WITH MEDIA CHANNEL BETWEEN SUBSTRATES

(71) Applicant: TT Electronics Plc, Carrollton, TX (US)

(72) Inventors: Shivesh Langhanoja, Flower Mound, TX (US); Brent Hans Larson, Dallas, TX (US)

(73) Assignee: TT ELECTRONICS PLC, Carrollton, TX (US)

( * ) Notice: Subject to any disclaimer, the term of this patent is extended or adjusted under 35 U.S.C. 154(b) by 0 days.

(21) Appl. No.: 15/589,611

(22) Filed: May 8, 2017

(65) Prior Publication Data

US 2018/0323083 A1  Nov. 8, 2018

(51) Int. Cl.
| | | |
|---|---|---|
| *G01L 19/14* | (2006.01) | |
| *G01L 19/06* | (2006.01) | |
| *B81B 7/00* | (2006.01) | |
| *G01L 19/00* | (2006.01) | |
| *H01L 21/56* | (2006.01) | |
| *H01L 23/28* | (2006.01) | |
| *H01L 23/00* | (2006.01) | |

(52) U.S. Cl.
CPC ........ *H01L 21/561* (2013.01); *G01L 19/0627* (2013.01); *G01L 19/147* (2013.01); *H01L 21/56* (2013.01); *H01L 23/28* (2013.01); *H01L 24/97* (2013.01); *B81B 7/0032* (2013.01); *B81B 2201/0264* (2013.01); *G01L 19/0061* (2013.01); *G01L 19/141* (2013.01)

(58) Field of Classification Search
CPC . G01L 19/0627; G01L 19/141; G01L 19/147; G01L 19/0061; B81B 2201/0264; B81B 7/0032; B81B 2201/01–2201/0292
See application file for complete search history.

(56) References Cited

U.S. PATENT DOCUMENTS

| | | |
|---|---|---|
| 5,285,690 A | 2/1994 | Koen et al. |
| 6,432,737 B1 | 8/2002 | Sonoda |
| 6,927,482 B1 | 8/2005 | Kim et al. |
| 7,089,799 B2 | 8/2006 | Nomua et al. |
| 7,270,009 B2 * | 9/2007 | Miyashita ............... G01L 19/04 73/715 |

(Continued)

OTHER PUBLICATIONS

SEMI Pressure Sensors, "Amplified Analog Digital", http://www.si-micro.com/en/category/name/ampp-ana-digi/page/, dated Apr. 25, 2017, 2 pages.

(Continued)

*Primary Examiner* — Mohsen Ahmadi
(74) *Attorney, Agent, or Firm* — Haynes and Boone, LLP

(57) ABSTRACT

A sensor device including: a first substrate having a bottom surface and a top surface; a second substrate having a bottom surface and a top surface, a media channel having two vertical sections and a horizontal section, wherein the two vertical sections are through the second substrate, a portion of the bottom surface of the second substrate forms a top surface of the horizontal section, and a portion of the top surface of the first substrate forms a bottom surface of the horizontal section; a sensor chip disposed on one of the two vertical sections of the media channel; and a molding compound covering side surfaces of the first substrate, the second substrate, and the sensor chip.

19 Claims, 13 Drawing Sheets

(56) References Cited

U.S. PATENT DOCUMENTS

| | | |
|---|---|---|
| 7,282,786 B2 | 10/2007 | Jung et al. |
| 7,560,811 B2 | 7/2009 | Sakakibara |
| 7,781,852 B1 | 8/2010 | Faheem et al. |
| 7,994,618 B2 | 8/2011 | Deke et al. |
| 8,234,926 B2 | 8/2012 | Wohl et al. |
| 8,378,435 B2 | 2/2013 | Lo et al. |
| 8,652,866 B2 | 2/2014 | Elian et al. |
| 9,061,888 B2 | 6/2015 | Pahl et al. |
| 9,297,713 B2 | 3/2016 | Lo et al. |
| 9,362,479 B2 | 6/2016 | Lo |
| 9,643,836 B2* | 5/2017 | Brida ............... G01L 9/0045 |
| 2004/0129947 A1* | 7/2004 | Miyashita ........... G01L 9/0073 |
| | | 257/99 |
| 2005/0269654 A1* | 12/2005 | Tanaka ............... G01L 9/0054 |
| | | 257/415 |
| 2007/0169559 A1* | 7/2007 | Tsuda ............... G01L 19/0007 |
| | | 73/756 |
| 2008/0229840 A1 | 9/2008 | Shirasaka et al. |
| 2009/0266173 A1 | 10/2009 | Kobayashi et al. |
| 2011/0016981 A1 | 1/2011 | Gebauer et al. |
| 2011/0079085 A1* | 4/2011 | Kanda ................. G01L 15/00 |
| | | 73/714 |
| 2011/0083513 A1 | 4/2011 | Wohlgemuth et al. |
| 2011/0137580 A1 | 6/2011 | Bartels et al. |
| 2012/0267239 A1 | 10/2012 | Chen et al. |
| 2013/0187295 A1* | 7/2013 | Reitmeier ........... G01D 11/245 |
| | | 257/787 |
| 2014/0306300 A1* | 10/2014 | Gunthner ........... G01P 15/0802 |
| | | 257/417 |
| 2014/0366646 A1* | 12/2014 | Matsuzawa ............. G01L 1/16 |
| | | 73/862.68 |
| 2015/0001645 A1 | 1/2015 | Faralli et al. |
| 2015/0062837 A1 | 3/2015 | Greiner et al. |
| 2015/0249043 A1* | 9/2015 | Elian ................... B29C 64/106 |
| | | 257/684 |

OTHER PUBLICATIONS

MEMS Pressure Sensor, "Amphenol Advanced Sensors", http://www.amphenol-sensors.com/en/products/pressure-mems/mems-sensors/, Apr. 25, 2017, 2 pages.

Honeywell, SX SMT Series, "Microstructure Pressure Sensors 0 psi to 1 psi through 0 psi to 150 psi", Apr. 2008, 4 pages.

Notification of Transmittal of the International Search Report and the Written Opinion of the International Searching Authority, or the Declaration (PCT/ISA/220), International Search Report (PCT/ISA/210), and the Written Opinion of the International Searching Authority (PCT/ISA/237), International application No. PCT/US2018/031192 dated Jul. 23, 2018, 14 pages.

* cited by examiner

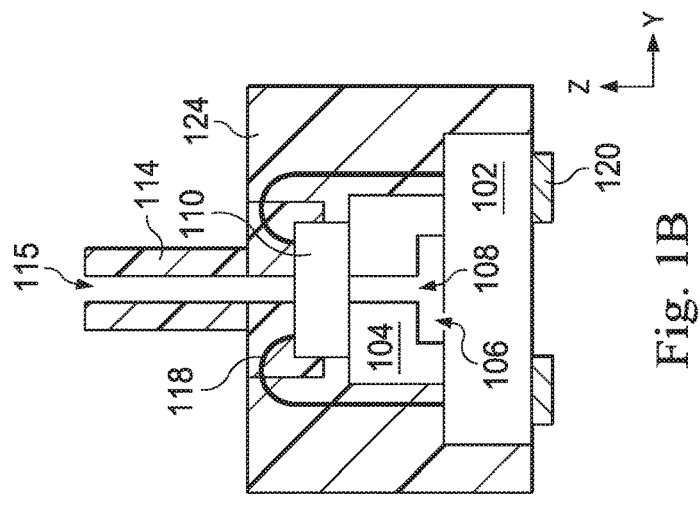
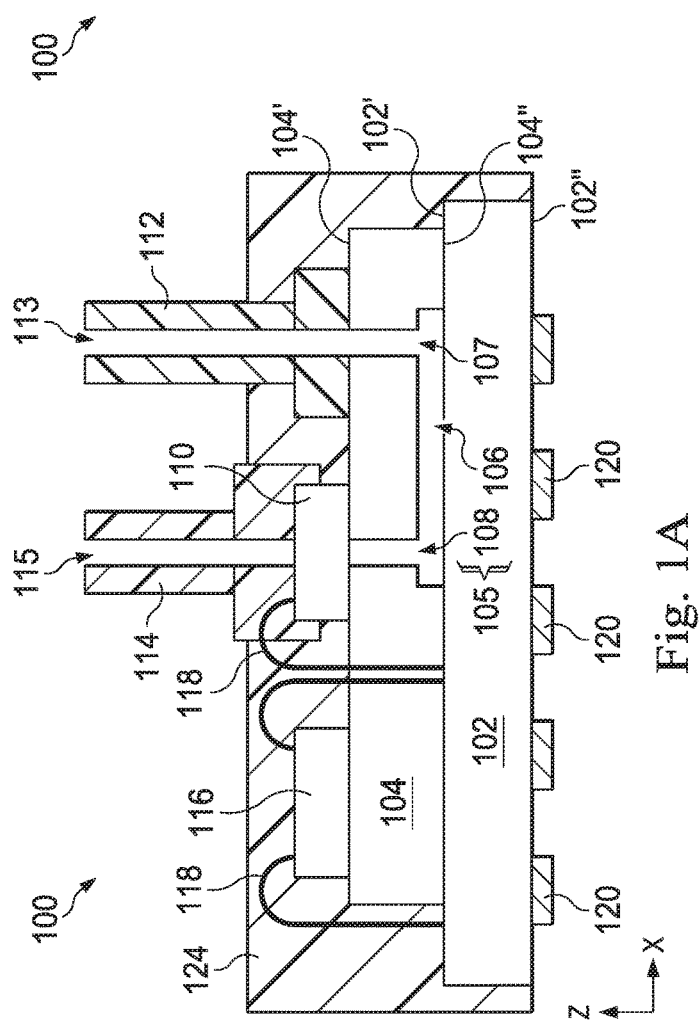

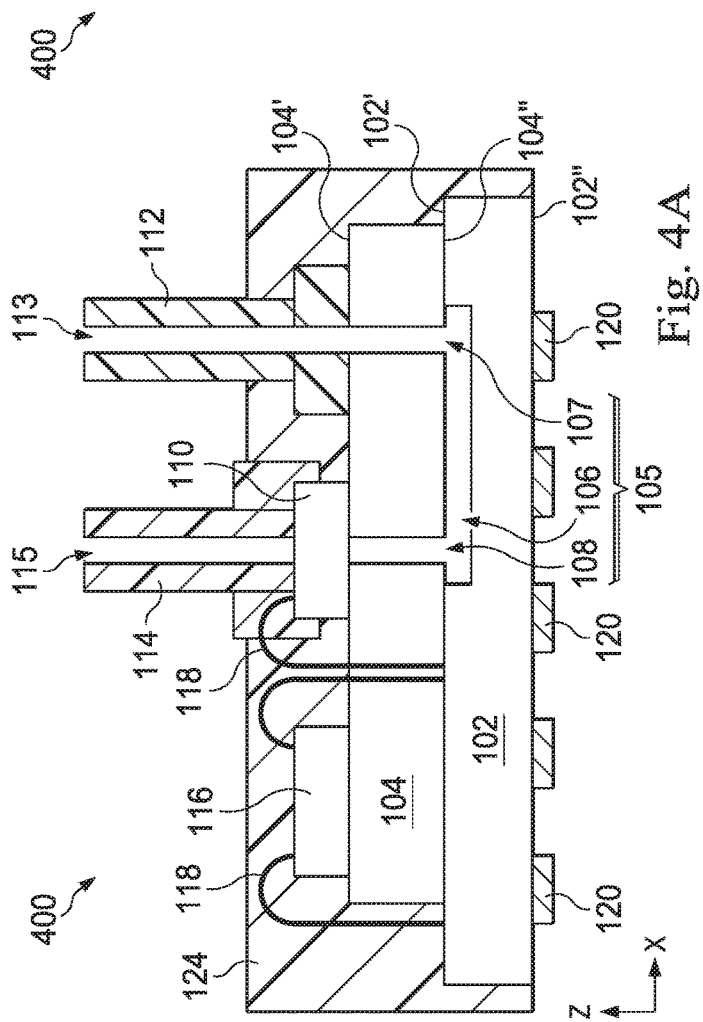

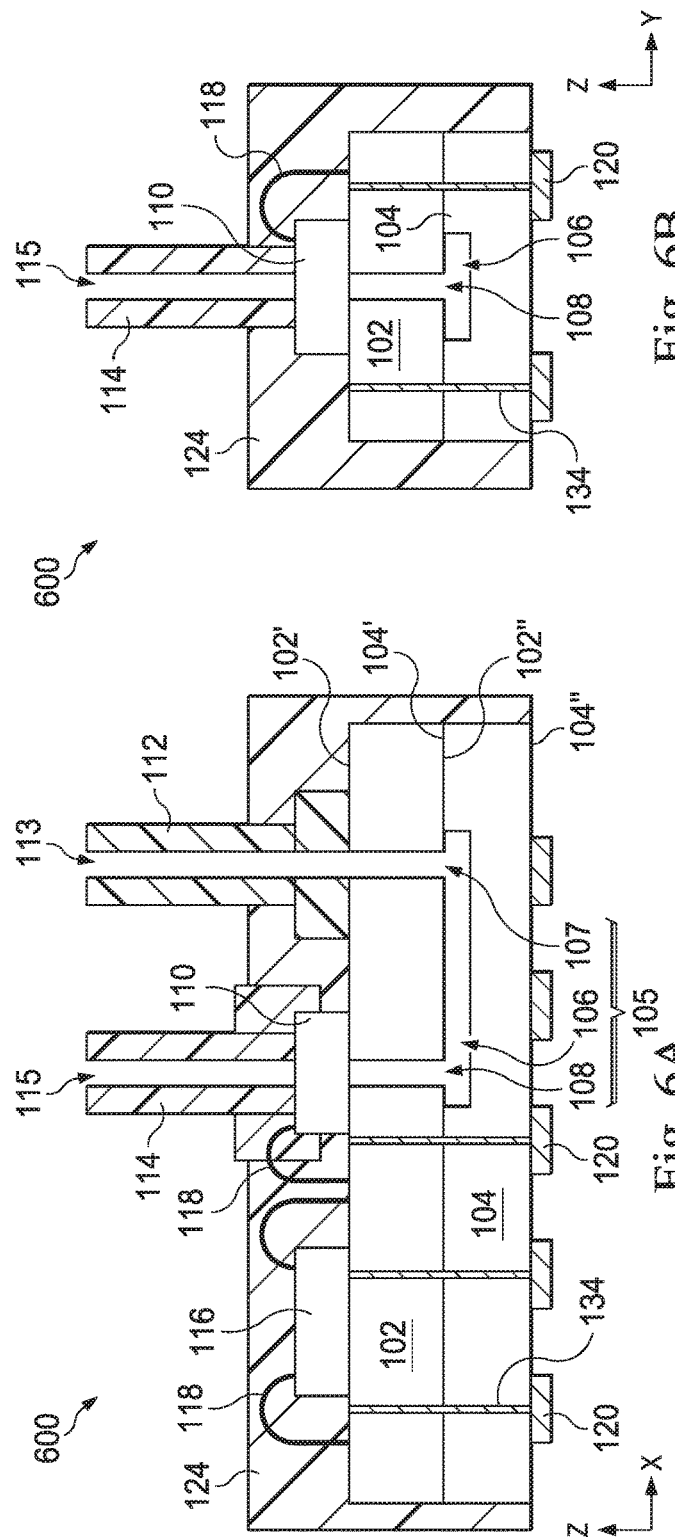

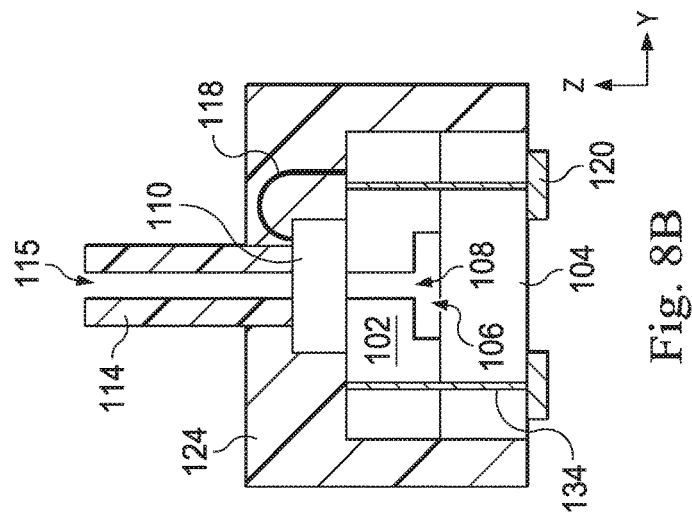
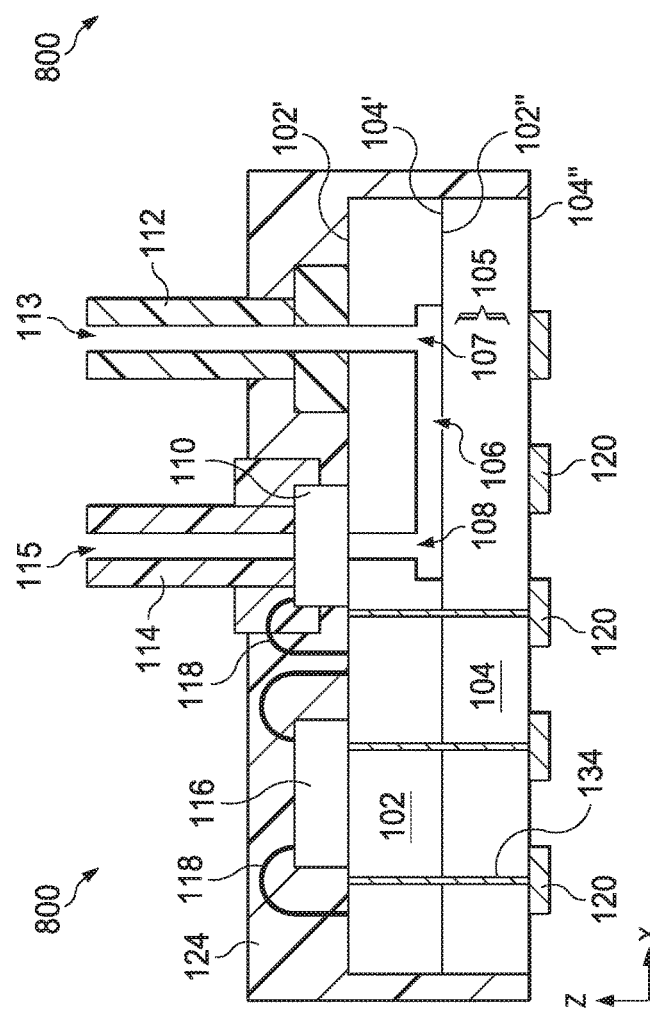
Fig. 8B
Fig. 8A

SENSOR DEVICE WITH MEDIA CHANNEL BETWEEN SUBSTRATES

BACKGROUND

Sensor devices, such as pressure sensor devices, are widely used in many applications. For example, pressure sensor devices can be used for monitoring tire pressure in automotive tires or for monitoring air pressure in an air filter system. Acoustic sensors can be used for detecting acoustic waves or sound. Optical sensors can be used for detecting light wave or light beam. In a typical application, one or more sensor devices are usually integrated with other components in a system. To reduce the size and the cost of the system, it is highly desirable to have the sensor device(s) in a small form factor, yet reliable, package. However, this task remains challenging. For example, some existing pressure sensor devices have a pressure sensor chip mounted on a substrate and covered with a plastic lid. An epoxy sealant is applied between the substrate and the plastic lid to hold pressure therein. Such solution is not completely satisfactory for a few reasons. For example, using epoxy sealant may lead to a higher manufacturing cost due to extended assembly time and increased process complexity. In addition, epoxy sealant may fail over time.

Accordingly, improvements in the packaging of sensor devices are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1A and 1B are schematic cross-sectional views of an example sensor device having two substrates, constructed according to some aspects of the present disclosure.

FIG. 1A is a view taken along the A-A line in FIG. 1C. FIG. 1B is a view taken along the B-B line in FIG. 1C.

FIGS. 4A and 4B are schematic cross-sectional views of another example sensor device, constructed according to some aspects of the present disclosure.

FIGS. 6A and 6B are schematic cross-sectional views of another example sensor device having two substrates, constructed according to some aspects of the present disclosure.

FIG. 6A is a view taken along the C-C line in FIG. 6C. FIG. 6B is a view taken along the D-D line in FIG. 6C.

FIGS. 8A and 8B are schematic cross-sectional views of yet another example sensor device, constructed according to some aspects of the present disclosure.

DETAILED DESCRIPTION

Figure 1C:
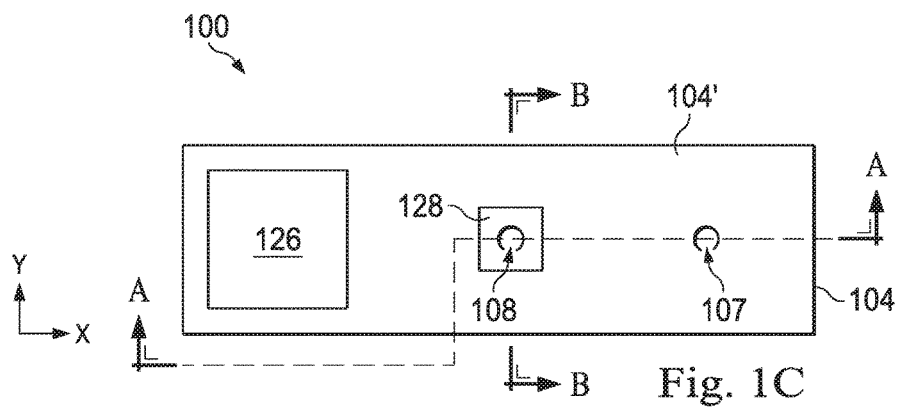
FIGS. 1C, 1D, and 1E are schematic plan views of some example surfaces of the two substrates of FIGS. 1A and 1B, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. Any alterations and further modifications to the described devices, systems, methods, and any further application of the principles of the present disclosure are fully contemplated as would normally occur to one having ordinary skill in the art to which the disclosure relates. For example, the features, components, and/or steps described with respect to one embodiment may be combined with the features, components, and/or steps described with respect to other embodiments of the present disclosure to form yet another embodiment of a device, system, or method according to the present disclosure even though such a combination is not explicitly shown. Further, for the sake of simplicity, in some instances the same reference numerals are used throughout the drawings to refer to the same or like parts.

Further, spatially relative terms, such as "beneath," "below," "lower," "bottom," "above," "upper," "over," "on," "top," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to sensor devices and methods of making the same. More particularly, the present disclosure is related to assembling a sensor chip (or a sensor die) and other components (if any) with over-molding to create a small form factor package. In a preferred embodiment, a signal processing chip (or a signal processing die) is over-molded together with the sensor chip. According to embodiments of the present disclosure, the sensor chip and the other components are mounted onto a top substrate supported by a bottom substrate, wherein the top and bottom substrates may comprise same or different materials. A media channel is provided with a recess between the two substrates and two holes through the top substrate. The media channel provides access to the bottom side of the sensor chip for the purposes of sensing. The sensor chip, any other components, and the two substrates are over-molded to create a small form factor package. The over-molding not only protects the various components, but also provides mechanical strength and reliability to the sensor device. Compared with traditional sensor device packaging methods, the present disclosure provides a simpler manufacturing flow and produces a smaller and more reliable sensor device package.

Figure 1D:
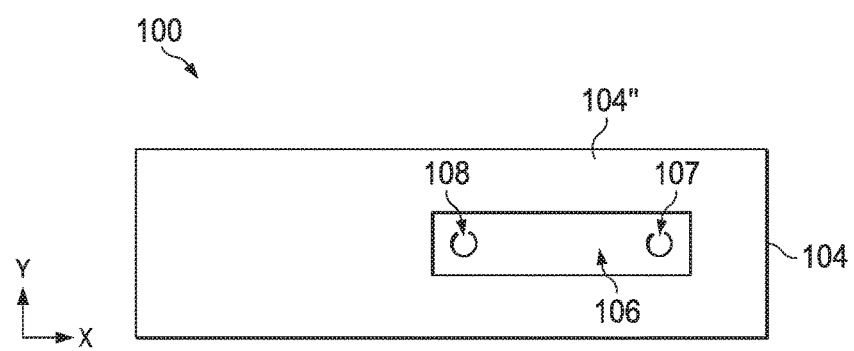
Figure 1E:
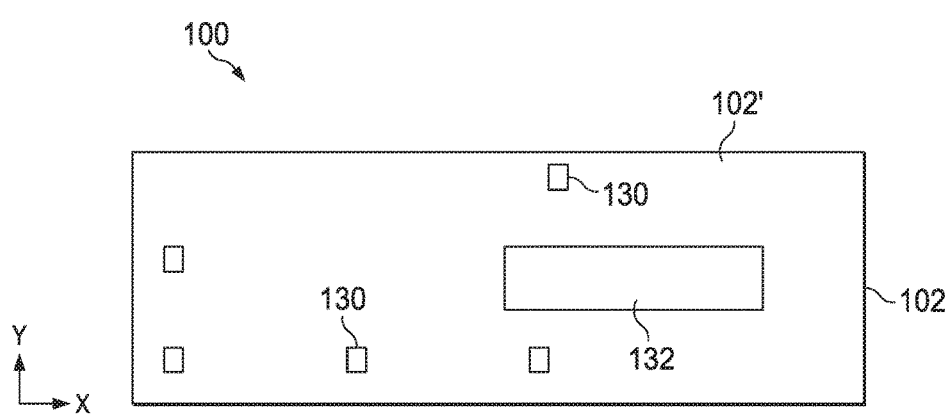

Referring to FIGS. 1A-1E, shown therein is a sensor device 100 constructed according to some aspects of the present disclosure. In a brief overview, the sensor device 100 includes a bottom substrate 102, a top substrate 104, a sensor chip 110, an optional signal processing chip 116, and an over-molding compound 124 covering the various components. FIG. 1C shows a schematic plan view of the top surface 104' of the substrate 104. FIG. 1D shows a schematic plan view of the bottom surface 104" of the substrate 104. FIG. 1E shows a schematic plan view of the top surface 102' of the substrate 102. FIG. 1A is a cross-sectional view of the sensor device 100 along the A-A line of FIG. 1C. FIG. 1B is a cross-sectional view of the sensor device 100 along the B-B line of FIG. 1C. The sensor device 100 is further described below by referring to FIGS. 1A-1E collectively.

The substrate 104 is disposed over the substrate 102. The substrates 102 and 104 may be attached together by adhesive or other mechanisms (not shown). In the present embodiment, the substrates 102 and 104 comprise different materials. For example, the substrate 102 comprises a printed circuit board (PCB) and the substrate 104 comprises a plastic material, a metallic material such as copper or copper alloy, or another material depending on the application of the sensor device 100. In the present embodiment, the substrate 102 is a double-sided PCB (having metal layers on top and bottom surfaces of an insulating material). Any PCB materials (such as FR-2 and FR-4) may be used for the substrate 102. Further, the substrate 102 may include one or more layers of PCB. In an alternative embodiment, each of the substrates 102 and 104 comprises a PCB. To further this embodiment, the two PCB substrates 102 and 104 may be soldered or fused together to form both the mechanical seal and any electrical connectivity.

A media channel 105 is provided at least partially in the substrate 104. The media channel 105 is a hollow and continuous channel that is configured for an application medium such as air, a fluid, or a light beam to propagate there-through and to be sensed by the sensor chip 110. The media channel 105 has a horizontal section 106 and two vertical sections 107 and 108. The horizontal section 106 is formed between the bottom surface 104" of the substrate 104 and the top surface 102' of the substrate 102. In the present embodiment, the horizontal section 106 is formed by a recessed bottom surface 104" and a portion of substantially flat top surface 102'. The horizontal section 106 may have a rectangular, circular, or elliptical shape or other suitable shape in the Y-Z cross-section. The two vertical sections 107 and 108 are formed as two holes through the substrate 104, and each may have a circular, elliptical, or polygonal shape or other suitable shape in the X-Y plane (see FIGS. 1C and 1D). When the substrate 104 comprises a plastic material, the media channel 105 of the present embodiment may be formed by molding the plastic material to have the specific shapes. When the substrate 104 comprises a metallic material, the media channel 105 of the present embodiment may be formed by etching, milling, drilling, pressing, or other suitable processes. When the substrate 104 comprises a PCB, the media channel 105 of the present embodiment may be formed by etching, milling, drilling, or other suitable processes. Various other processes of forming the media channel 105 are contemplated to be within the scope of the present disclosure.

Figure 2A:
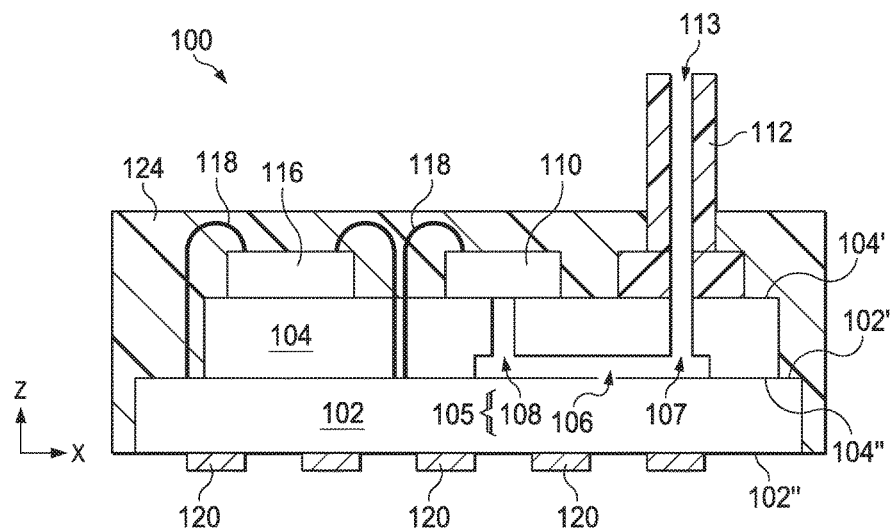
FIG. 2A is a schematic cross-sectional view of an example sensor device, constructed according to some aspects of the present disclosure.
Figure 2B:
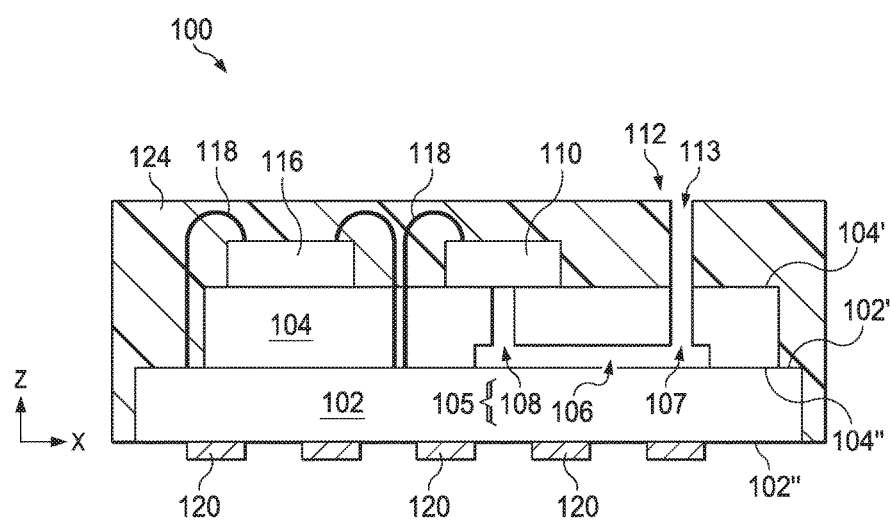
FIG. 2B is a schematic cross-sectional view of an example sensor device, constructed according to some aspects of the present disclosure.

The sensor chip 110 is disposed on the top surface 104' of the substrate 104, and directly on the vertical section 108. The sensor device 100 further includes a port (or a tube) 112 having an inlet 113. The port 112 is disposed on the top surface 104'. In the present embodiment, the port 112 has a cylindrical shape with the inlet 113 aligned with the vertical section 107. However, in various embodiments, the port 112 may have any suitable shape, straight or curved, and the inlet 113 may or may not be aligned with the vertical section 107. The application medium (e.g., air, fluid, or light) may propagate through the port 112 and the media channel 105 to reach a sensing area at the bottom surface of the sensor chip 110. The substrates 102 and 104 may be attached by some adhesive and are further reinforced by the molding compound 124 such that the media channel 105 acts as a substantially sealed passageway for the application medium. In an alternative embodiment, the port 112 may be formed as part of the molding compound 124 instead of a standalone tube, which is shown in FIG. 2B to be further described.

When the application medium is not corrosive to the substrates 102 and 104, the media channel 105 may not need special surface treatment. For example, when the sensor device 100 is for pressure measurements and the application medium is air (or a non-corrosive gas), a plastic material in the substrate 104 and a fiberglass material in the substrate 102 may be sufficient for sealing the media channel 105. To improve the sealing of the media channel 105, the portion of the top surface of the substrate 102 that is also the bottom surface of the media channel 105 may be covered with copper, plated copper, copper alloy, plated copper alloy, gold, plated gold, or other suitable material, thereby forming a channel surface pad 132 (FIG. 1E). In an embodiment, the channel surface pad 132 may be designed and manufactured as a copper area on the PCB substrate 102.

When the application medium is corrosive to the substrate 104, the substrate 102, and/or the sensor chip 110, some anti-corrosion mechanism may be employed in the sensor device 100. For example, the bottom surface of the sensor chip 110 may be covered with a protective membrane. For another example, the channel surface pad 132 may be covered with a corrosion-resistant material such as a film of plated gold. For a further example, the surfaces of the media channel 105 in the substrate 104 may be sprayed, plated, or otherwise formed with a film of anti-corrosion material.

Furthermore, the surfaces of the media channel 105 are designed appropriately for the propagation of the application media. For example, when the application medium is air, a gas, or a fluid, the surfaces of the media channel 105 may be properly sealed and optionally treated (discussed above) to allow the application medium to flow there-through. For another example, when the application medium is a light beam, the surfaces of the media channel 105 may be made reflective (e.g., with mirror finish) to allow the light beam to propagate from the inlet 113 to the bottom surface of the sensor chip 110 through internal reflection.

Still referring to FIGS. 1A and 1B, in the present embodiment, the sensor device 100 further includes a second port (or tube) 114 disposed on the top surface of the sensor chip 110. The port 114 has an inlet 115, through which a sensing area at the top surface of the sensor chip 110 is accessed. This is an embodiment where the sensor chip 110 is configured to perform a differential sensing function. In other words, the sensor chip 110 is configured to sense the difference (e.g., air pressure) applied to its top surface (through the port 114) and its bottom surface (through the port 112). In some other embodiments (such as shown in FIG. 2A), the sensor chip 110 is configured to perform a single-sided sensing function and the port 114 is therefore not included in the sensor device 100. In various embodiments, the port 114 may have any suitable shape, straight or curved, and the inlet 115 may or may not be aligned with the vertical section 108. Further, the port 114 may also be formed as part of the molding-compound 124 instead of a standalone tube in some embodiment, similar to the port 112 in FIG. 2B.

The sensor device 100 further includes a signal processing chip 116 disposed over the substrate 104 in the present embodiment. The signal processing chip 116 may be an application specific integrated circuit (ASIC), a logic device, a processor, a microcontroller, or other suitable semiconductor device that is configured to control the sensor chip 110 and/or to receive and process signals generated by the sensor chip 110. Referring to FIG. 1C, in the present embodiment, the top surface 104' of the substrate 104 includes die attachment areas 126 and 128 on which the signal processing chip 116 and the sensor chip 110, respectively, may be disposed. For example, the signal processing chip 116 and the sensor chip 110 may be attached to the die attachment areas 126 and 128, respectively, using an adhesive or tape (not shown) which may be electrically insulating or conducting. The die attachment areas 126 and 128 may have die pads for the attachment purpose, or may include bumped areas for ensuring the alignment and position of the signal processing chip 116 and the sensor chip 110. The sensor device 100 further includes bond wires 118 electrically connecting the signal processing chip 116 and the sensor chip 110 to bonding contacts 130 (FIG. 1E) on the top surface 102' of the substrate 102. In the present embodiment, the substrate 104 is designed to be narrower than the substrate 102 in width and/or in length so that the bond wires 118 may pass around the outside of the substrate 104. This reduces manufacturing cost by providing more tolerance in the bond wire attachment. The substrate 104 may be designed to have a regular or irregular shape in various embodiments. The bond wires 118 may comprise aluminum, copper, gold, gold plated copper, or other suitable material. The substrate 102, which is a PCB in the present embodiment, may provide electrical connection(s) between the signal processing chip 116 and the sensor chip 110 using conductive traces. In various embodiments, the sensor chip 110 may be electrically connected to the signal processing chip 116 by a direct wire bonding between the two, in addition to or alternative to the electrical connections through the substrate 102. The sensor device 100 may further include other active or passive components (not shown), such as resistors and capacitors, mounted on the top surface 104' of the substrate 104. In some embodiments, the sensor device 100 may further include active or passive components (not shown) mounted on the top surface 102' of the substrate 102 in areas that is not occupied by the substrate 104. In another embodiment, the sensor device 100 does not include the signal processing chip 116. For example, the sensor device 100 may provide the outputs of the sensor chip 110 to a system board which provides electrical connection between the sensor chip 110 and some signal processing chip.

Referring to FIGS. 1A and 1B, the sensor device 100 further includes contact pads 120 disposed on the bottom surface 102'' of the substrate 102. The contact pads 120 are electrically connected to the signal processing chip 116, the sensor chip 110, and/or other electronic components through conductive routing (e.g., vias) in the substrate 102. In an application, the sensor device 100 may be integrated into a system by soldering the contact pads 120 onto a system board. Having the contact pads 120 at the bottom surface of the sensor device 100 reduces the footprint of the sensor device 100 and saves the system board area.

The sensor device 100 further includes the molding compound 124. The molding compound 124 may be a plastic, an epoxy, a silica-filled resin, a ceramic, a combination thereof, or other suitable material. The molding compound 124 provides natural sealing of the sensor device 100 and is in mechanical contact with the side surfaces of the substrate 102, the top and side surfaces of the substrate 104, the signal processing chip 116, the sensor chip 110, the bond wires 118, and any other components on the top surface 104'. The molding compound 124 does not cover the contact pads 120. The molding compound 124 provides protection to the various components of the sensor device 100 from the operating environment. It also provides mechanical strength to the sensor device 100. Particularly, it provides clamping force to the substrates 102 and 104, thereby increasing the range of pressure that the sensor device 100 may operate in. In the embodiment as illustrated in FIGS. 1A and 1B, a lower portion of the port 112 is also over-molded by the molding compound 124, thereby becoming a fixture of the sensor device 100. In contrast, the port 114 may be removably attached to the top of the sensor chip 110. In various embodiments, each of the ports 112 and 114, independently, may be fixedly installed (e.g., over-molded by the molding compound 124) in the sensor device 100, or may be removably attached to the sensor device 100 (i.e., it can be plugged and unplugged as needed). Further, as discussed above, each of the ports 112 and 114 may be part of the molding compound 124, e.g., formed by the over-molding process, rather than a standalone piece.

The placement of the various components including the signal processing chip 116, the sensor chip 110, and the ports 112 and 114 on the top surface 104' as shown in FIGS. 1A-1E is exemplary and is not intended to limit the provided subject matter. Similarly, the number of and the placement of the contact pads 130, are also exemplary and do not limit the provided subject matter.

Figure 1F:
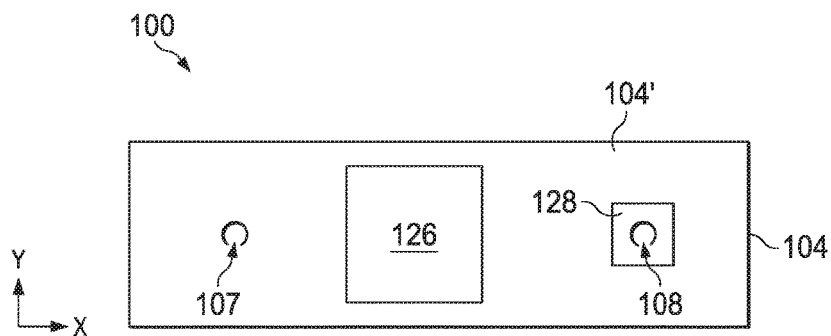
FIGS. 1F, 1G, and 1H are schematic plan views of some example surfaces of the two substrates of FIGS. 1A and 1B, in an alternative embodiment.
Figure 1G:
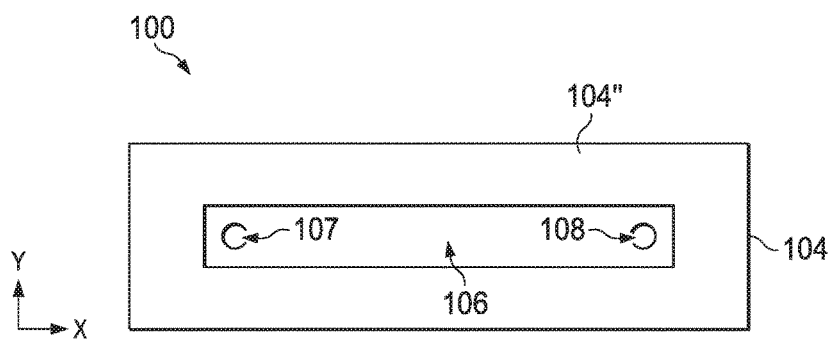
Figure 1H:
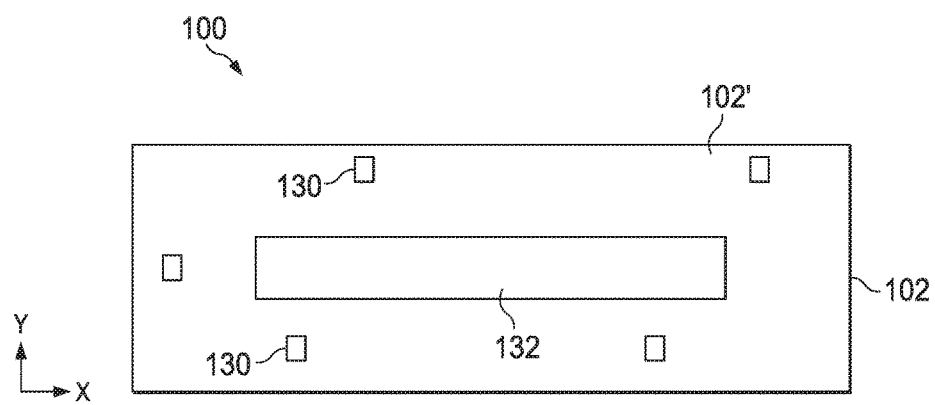

FIGS. 1F-1H illustrate another exemplary configuration of the sensor device 100, constructed according to embodiments of the present disclosure. Referring to FIGS. 1F and 1G, the die attachment area 126 (corresponding to the signal processing chip 116) interposes the die attachment area 128 (corresponding to the sensor chip 110) and the vertical section 107 (corresponding to the port 112). The horizontal section 106 and the channel surface pad 132 straddle underneath the die attachment area 126. In other words, the horizontal section 106 and the channel surface pad 132 are directly underneath the signal processing chip 116. The configuration shown in FIGS. 1F-1H may make the sensor device 100 very compact. Many other configurations of the sensor device 100 are contemplated to be within the scope of the present disclosure.

FIG. 2A illustrates an embodiment of the device 100 for performing a single-sided sensing function. The port 114 is not included in this sensor device 100. FIG. 2B illustrates another embodiment of the device 100 where the port 112 is merely a part of the molding compound 124. The recess 113 may be molded by using a pin as part of the over-mold process.

Figures 3A, 3B:
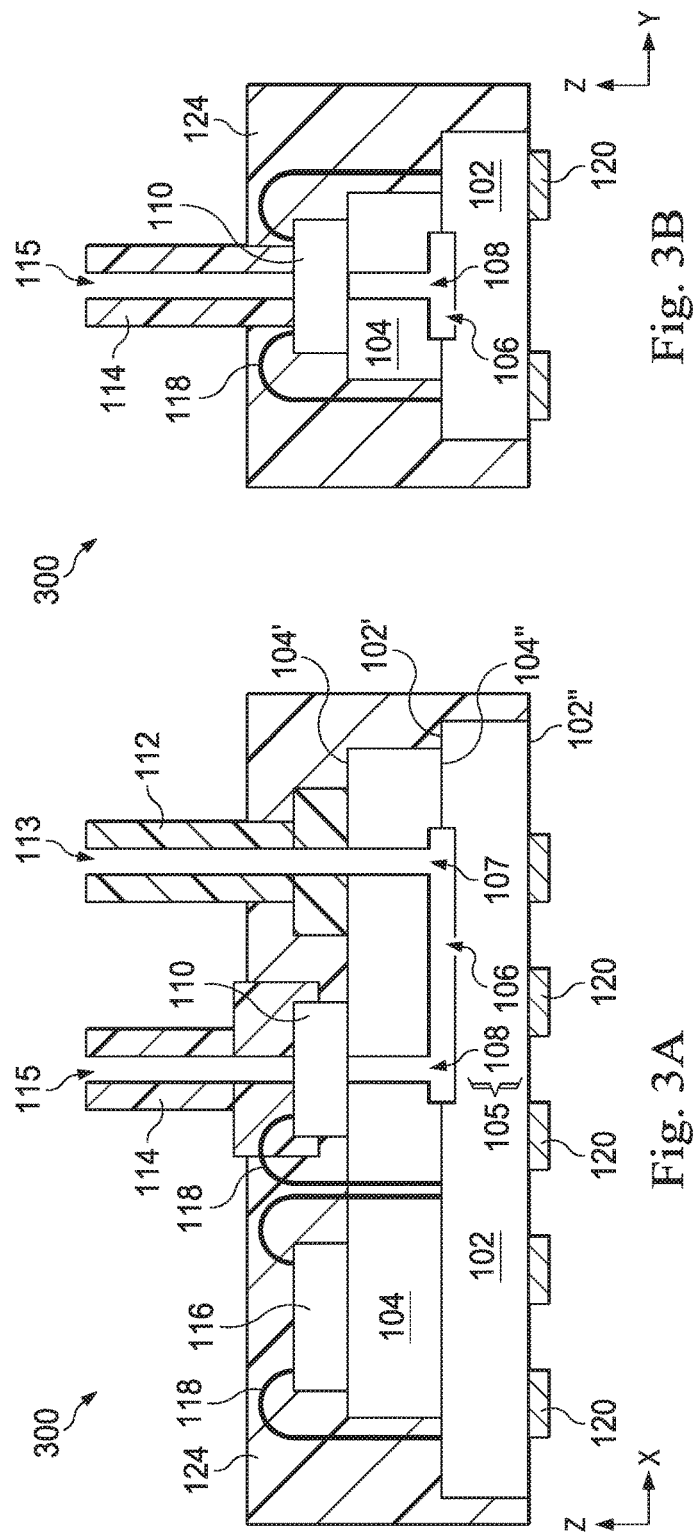
FIGS. 3A and 3B are schematic cross-sectional views of an example sensor device, constructed according to some aspects of the present disclosure.

FIGS. 3A-3B illustrate cross-sectional views of another sensor device 300, constructed according to aspects of the present disclosure. Similar to the sensor device 100, the sensor device 300 also includes the substrates 102 and 104, the media channel 105, the sensor chip 110, the optional signal processing chip 116, the port 112 and the optional port 114, the bond wires 118, the contact pads 120, and the molding compound 124. The substrate 104 is disposed over the substrate 102. The devices 110 and 116 are disposed over the substrate 104. In an embodiment of the sensor device 300, the substrate 102 comprises a PCB, and the substrate 104 comprises a plastic material or a metallic material such as copper or copper alloy. In another embodiment, each of the substrates 102 and 104 comprises a PCB. For the purposes of simplicity, many aspects of the sensor device 300 are omitted in the following discussion.

Still referring to FIGS. 3A-3B, the media channel 105 includes a horizontal section 106 and two vertical sections 107 and 108. The horizontal section 106 is formed between a recessed portion of the top surface 102' and a recessed portion of the bottom surface 104". The recessed portion of the top surface 102' and the recessed portion of the bottom surface 104" may or may not have the same shape or size. The recessed portion of the top surface 102' may be formed by a drilling or milling process, e.g., formed as a milled slot when the PCB substrate 102 is manufactured. The recessed portion of the top surface 102' may be covered with copper, plated copper, copper alloy, plated copper alloy, or other suitable material for the purposes of sealing the media channel 105. The recessed portion of the bottom surface 104" and the two vertical sections 107 and 108 may be formed by a molding process, or other suitable processes. The surfaces of the media channel 105 may be properly treated with a corrosion resistant material based on the application media, as discussed above.

The sensor device 300 may include both the ports 112 and 114 for performing a differential sensing function. Alternatively, the sensor device 300 may include the port 112 without the port 114 for performing a single-sided sensing function. Furthermore, each of the ports 112 and 114 may be over-molded into the sensor device 300, or may be pluggable into the sensor device 300. Still further, each of the ports 112 and 114, independently, may be formed as part of the molding compound 124 rather than a separate piece.

FIGS. 4A-4B illustrate cross-sectional views of another sensor device 400, constructed according to aspects of the present disclosure. Similar to the sensor device 100, the sensor device 400 also includes the substrates 102 and 104, the media channel 105, the sensor chip 110, the optional signal processing chip 116, the port 112 and the optional port 114, the bond wires 118, the contact pads 120, and the molding compound 124. The substrate 104 is disposed over the substrate 102. The devices 110 and 116 are disposed over the substrate 104. In an embodiment of the sensor device 400, the substrate 102 comprises a PCB, and the substrate 104 comprises a plastic material or a metallic material such as copper or copper alloy. In another embodiment, each of the substrates 102 and 104 comprises a PCB. For the purposes of simplicity, many aspects of the sensor device 400 are omitted in the following discussion.

Still referring to FIGS. 4A-4B, the media channel 105 includes a horizontal section 106 and two vertical sections 107 and 108. The horizontal section 106 is formed between a recessed portion of the top surface 102' and a substantially flat portion of the bottom surface 104". The recessed portion of the top surface 102' may be formed by a drilling or milling process, e.g., formed as a milled slot when the PCB substrate 102 is manufactured. The recessed portion of the top surface 102' may be covered with copper, plated copper, copper alloy, plated copper alloy, or other suitable material for the purposes of sealing the media channel 105. The vertical sections 107 and 108 may be formed by a molding process, or other suitable processes. The surfaces of the media channel 105 may be properly treated with a corrosion resistant material based on the application media, as discussed above.

The sensor device 400 may include both the ports 112 and 114 for performing a differential sensing function. Alternatively, the sensor device 400 may include the port 112 without the port 114 for performing a single-sided sensing function. Furthermore, each of the ports 112 and 114 may be over-molded into the sensor device 400, or may be pluggable into the sensor device 400. Still further, each of the ports 112 and 114, independently, may be formed as part of the molding compound 124 rather than a separate piece.

Figures 5A, 5B:
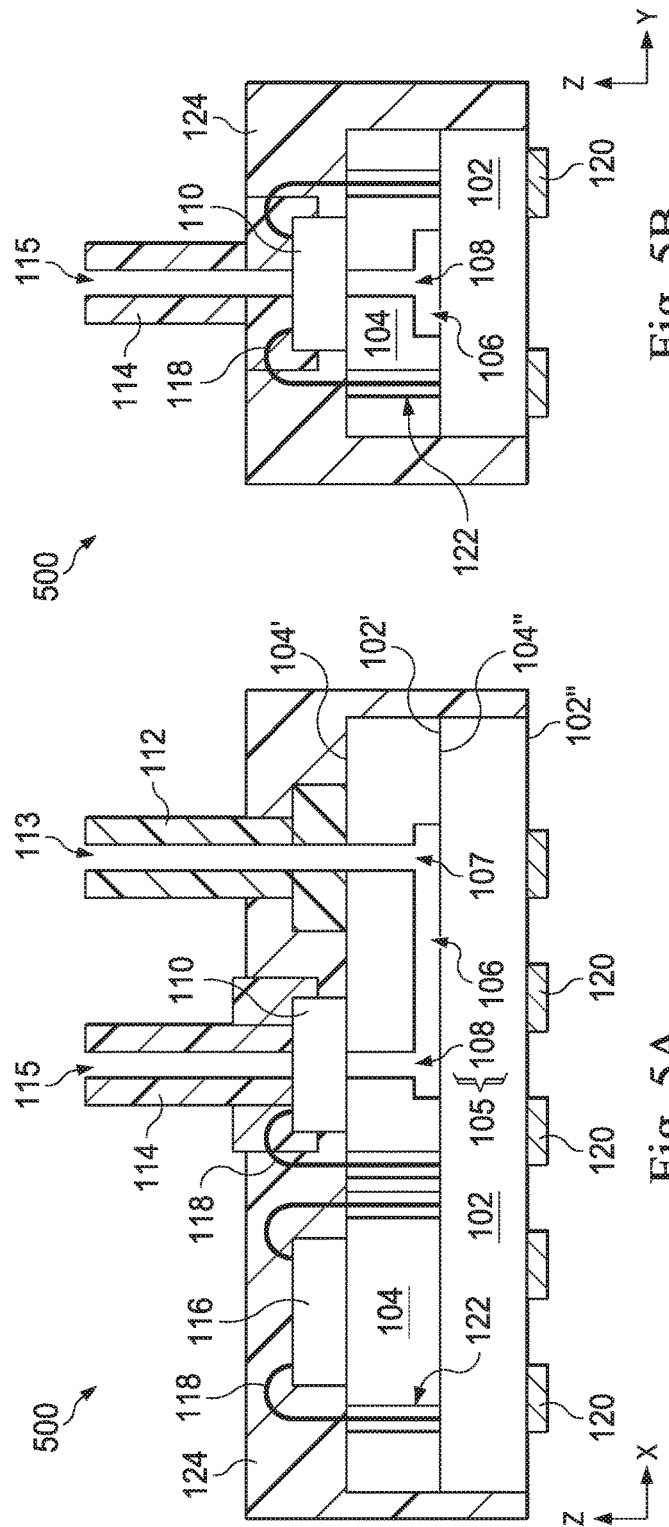
FIGS. 5A and 5B are schematic cross-sectional views of another example sensor device having two substrates, constructed according to some aspects of the present disclosure.

FIGS. 5A-5B illustrate cross-sectional views of another sensor device 500, constructed according to aspects of the present disclosure. Similar to the sensor device 100, the sensor device 500 also includes the substrates 102 and 104, the media channel 105, the sensor chip 110, the optional signal processing chip 116, the port 112 and the optional port 114, the bond wires 118, the contact pads 120, and the molding compound 124. The substrate 104 is disposed over the substrate 102. The devices 110 and 116 are disposed over the substrate 104. In an embodiment of the sensor device 500, the substrate 102 comprises a PCB, and the substrate 104 comprises a plastic material or a metallic material such as copper or copper alloy. In another embodiment of the sensor device 500, each of the substrates 102 and 104 comprises a PCB. The sensor device 500 may include the port 112 without the port 114 for performing a single-sided sensing function. Furthermore, each of the ports 112 and 114 may be over-molded into the sensor device 500, or may be pluggable into the sensor device 500. Still further, each of the ports 112 and 114, independently, may be formed as part of the molding compound 124 rather than a separate piece. For the purposes of simplicity, many aspects of the sensor device 500 are omitted in the following discussion.

Unlike the device 100, the device 500 is provided with holes 122 (or through-holes) 122 in the peripheral area of the substrate 104. The holes 122 may be formed in the same process (e.g., molding) that forms the media channel 105 in the substrate 104. The bond wires 118 are routed through the holes 122 to electrically connect the signal processing chip 116 and the sensor chip 110 to the bonding contacts 130 (e.g., FIG. 1E) on the top surface 102' of the substrate 102. The number of and the placement of the holes 122 may be provided flexibly based on design requirements. Moreover, the configuration of the media channel 105 of the device 500 may be varied in some embodiments similar to the devices 300 and 400 shown in FIGS. 3A-4B.

Figure 6C:
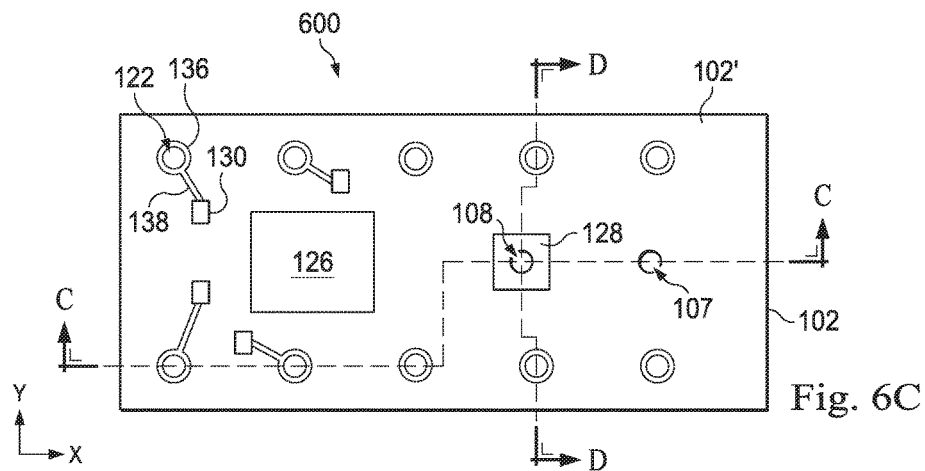
FIGS. 6C, 6D, and 6E are schematic plan views of some example surfaces of the two substrates of FIGS. 6A and 6B, in accordance with some embodiments.
Figure 6D:
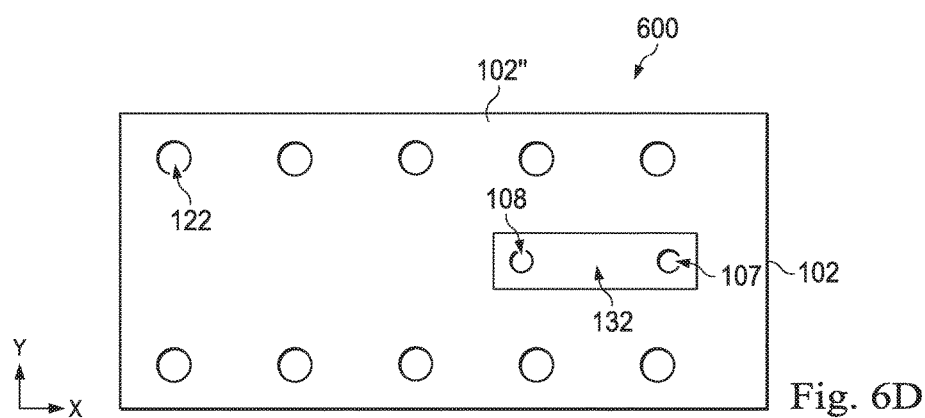
Figure 6E:
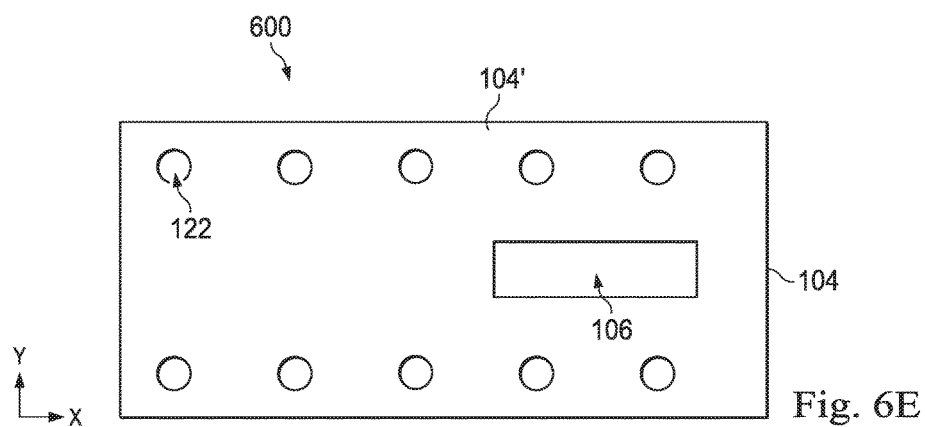

FIGS. 6A-6E illustrate another sensor device 600, constructed according to aspects of the present disclosure. Similar to the sensor device 100, the sensor device 600 also includes the substrates 102 and 104, the media channel 105, the sensor chip 110, the optional signal processing chip 116, the port 112 and the optional port 114, the bond wires 118, the contact pads 120, and the molding compound 124. FIG. 6C shows a schematic plan view of the top surface 102' of the substrate 102. FIG. 6D shows a schematic plan view of the bottom surface 102" of the substrate 102. FIG. 6E shows a schematic plan view of the top surface 104' of the substrate 104. FIG. 6A is a cross-sectional view of the sensor device 600 along the C-C line of FIG. 6C. FIG. 6B is a cross-sectional view of the sensor device 600 along the D-D line of FIG. 6C. For the purposes of simplicity, many aspects of the sensor device 600 are omitted in the following discussion.

Referring to FIGS. 6A-6B, in the present embodiment, the substrate 102 comprises a PCB, and the substrate 104 comprises a plastic material or a metallic material such as copper or copper alloy. In an alternative embodiment, each of the substrates 102 and 104 comprises a PCB. The substrates 102 and 104 may be designed to have the same size or different sizes. Compared to the sensor device 100, the sensor device 600 has the two substrates 102 and 104 reversed in their positions. In other words, the substrate 102 is disposed over the substrate 104 in the sensor device 600 and the devices 116 and 110 are disposed over the substrate 102. Many other differences between the sensor devices 100 and 600 are the results of this difference.

The media channel 105 is provided in the substrates 102 and 104. The media channel 105 has a horizontal section 106 and two vertical sections 107 and 108. The horizontal section 106 is formed between the bottom surface 102″ of the substrate 102 and the top surface 104′ of the substrate 104. In the present embodiment, the horizontal section 106 is formed by a recessed portion of the top surface 104′ and a portion of substantially flat bottom surface 102″. The horizontal section 106 may have a rectangular, circular, or elliptical shape or other suitable shape in the Y-Z cross-section. When the substrate 104 comprises a plastic material, the horizontal section 106 of the present embodiment may be formed by molding the plastic material to have the specific shape. When the substrate 104 comprises a metallic material, the horizontal section 106 of the present embodiment may be formed by etching, milling, drilling, pressing, or other suitable processes. When the substrate 104 comprises a PCB, the media channel 105 of the present embodiment may be formed by etching, milling, drilling, or other suitable processes. The two vertical sections 107 and 108 may be formed as two holes through the PCB substrate 102, and each may have a circular, elliptical, or polygonal shape or other suitable shape in the X-Y plane (see FIGS. 6C and 6D). The media channel 105 may be properly sealed and optionally treated based on the application media, such as discussed above with respect to the sensors device 100. For example, to improve the sealing of the media channel 105, the portion of the bottom surface 102′ that is also the top surface of the horizontal section 106 may be covered with copper, plated copper, copper alloy, plated copper alloy, or other suitable material, thereby forming a channel surface pad 132 (FIG. 6D). Further, the vertical sections 107 and 108 may be designed and manufactured as vias with copper, plated copper, copper alloy, plated copper alloy, or other suitable material on the sidewalls thereof.

Figure 6F:
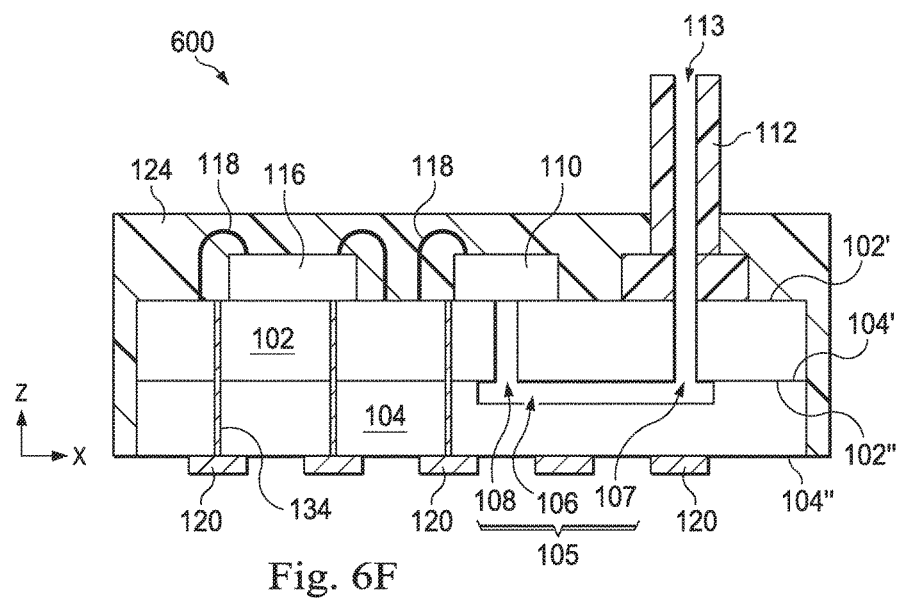
FIG. 6F is a schematic cross-sectional view of an example sensor device, constructed according to some aspects of the present disclosure.
Figure 6G:
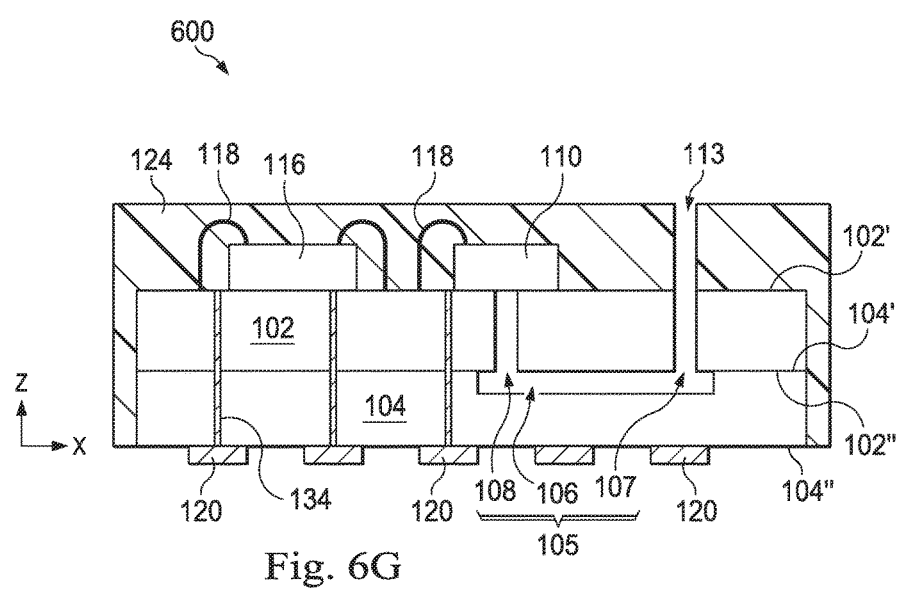
FIG. 6G is a schematic cross-sectional view of another example sensor device, constructed according to some aspects of the present disclosure.

The sensor device 600 may include both the ports 112 and 114 for performing a differential sensing function. Alternatively, the sensor device 600 may include the port 112 without the port 114 (see FIG. 6F) for performing a single-sided sensing function. Furthermore, each of the ports 112 and 114 may be over-molded into the sensor device 600, or may be pluggable into the sensor device 600. Still further, each of the ports 112 and 114, independently, may be formed as part of the molding compound 124 rather than a separate piece (e.g., see FIG. 6G).

The signal processing chip 116 and the sensor chip 110 may be electrically and mechanically connected to the PCB substrate 102 using any suitable mechanisms depending on the package of the devices 116 and 110. For example, each of the devices 116 and 110 may have a leaded type of package, a Ball Grid Array (BGA) type of package, a Land Grid Array (LGA) type of package, or the like. Referring to FIG. 6C, in the present embodiment, the top surface 102′ of the substrate 102 includes a signal processing die attachment area 126 and a sensor die attachment area 128. The signal processing chip 116 and the sensor chip 110 may be attached to the die attachment areas 126 and 128, respectively, using an adhesive or tape (not shown) that may be electrically insulating or conducting. The top surface 102′ further includes bonding contacts 130 for electrically bonding the signal processing chip 116 and/or the sensor chip 110 to the PCB substrate 102. In the present embodiment, the devices 116 and 110 are electrically bonded to the PCB substrate 102 through the bond wires 118. The sensor device 600 may also include bond wires 118 directly connecting the devices 116 and 110. In an alternative embodiment, each of the devices 116 and 110 may be electrically connected to the PCB substrate 102 through direct soldering without the bond wires 118.

Referring to FIGS. 6A-6B, the contact pads 120 are disposed on the bottom surface 104″ in this embodiment. The sensor device 600 further includes pins 134 through the substrates 104 and 102 and electrically connecting the contact pads 120 to at least one of the signal processing chip 116 and the sensor chip 110. In the present embodiment, each pin 134 and the corresponding contact pad 120 may be created as a single piece of hardware, for example, by stamping or etching a metal. During the assembling process, the pins 134 may be inserted from the bottom surface 104″ through the holes 122 to reach the top surface 102′. Referring to FIG. 6C, the top surface 102′ further includes soldering sites 136, some of which are electrically connected to the bonding contacts 130 through conductive traces 138. Some of the soldering sites 136 may be electrically floating, or connected to a ground plane (not shown). The pins 134 are soldered onto the soldering sites 136. The pins 134 not only make electrical connections, but also create a clamping force between the substrates 102 and 104, which reinforces the mechanical strength of the sensor device 600. In various embodiments, the placement of the various components including the signal processing chip 116, the sensor chip 110, and the ports 112 and 114 on the top surface 102′ as shown in FIGS. 6A-6E is exemplary and is not intended to limit the provided subject matter. Similarly, the number of and the placement of the holes 122, as well as the number of and the placement of the contact pads 130, are also exemplary and do not limit the provided subject matter.

Figures 7A, 7B:
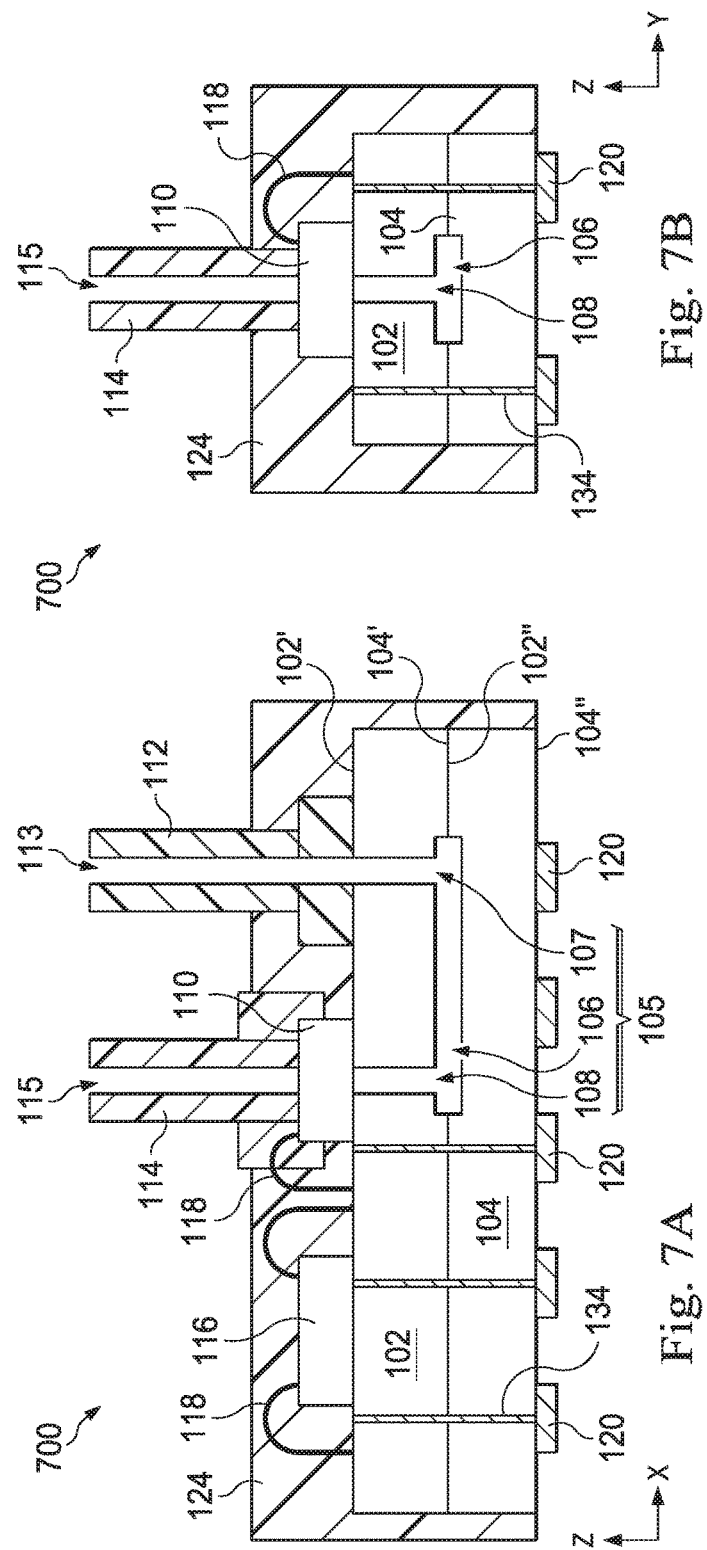
FIGS. 7A and 7B are schematic cross-sectional views of another example sensor device, constructed according to some aspects of the present disclosure.

FIGS. 7A-7B illustrate cross-sectional views of a sensor device 700, constructed according to aspects of the present disclosure. Similar to the sensor device 600, the sensor device 700 also includes the substrates 102 and 104, the media channel 105, the sensor chip 110, the optional signal processing chip 116, the port 112 and the optional port 114, the contact pads 120, the pins 134, and the molding compound 124. In an embodiment of the sensor device 700, the substrate 102 comprises a PCB, and the substrate 104 comprises a plastic material or a metallic material such as copper or copper alloy. In an alternative embodiment, each of the substrates 102 and 104 comprises a PCB. The substrate 102 is disposed over the substrate 104. The substrates 102 and 104 may be designed to have the same size or different sizes. The devices 116 and 110 are disposed over the substrate 102. The devices 116 and 110 may be electrically connected to the substrate 102 using bond wires 118, direct soldering (not shown), or other suitable mechanisms. For the purposes of simplicity, many aspects of the sensor device 700 are omitted in the following discussion.

Still referring to FIGS. 7A-7B, the media channel 105 includes a horizontal section 106 and two vertical sections 107 and 108. The horizontal section 106 is formed between a recessed portion of the top surface 104' and a recessed portion of the bottom surface 102". The recessed portion of the top surface 104' and the recessed portion of the bottom surface 102" may or may not have the same shape or size. The vertical sections 107 and 108 are formed as holes through the substrate 102. The recessed portion of the bottom surface 102" and the vertical sections 107 and 108 may be formed by one or more drilling processes when the substrate 102 is manufactured. For example, the recessed portion of the bottom surface 102" may be formed as a milled slot, while the vertical sections 107 and 108 may be formed as through-holes in the PCB substrate 102. The recessed portion of the bottom surface 102" and the vertical sections 107 and 108 may be covered by copper, plated copper, copper alloy, plated copper alloy, or other suitable material for the purposes of sealing the media channel 105. The recessed portion of the bottom surface 104" may be formed by a molding process, or other suitable processes. The surfaces of the media channel 105 may be properly treated with a corrosion resistant material based on the application media, as discussed above.

The sensor device 700 may include both the ports 112 and 114 for performing a differential sensing function. Alternatively, the sensor device 700 may include the port 112 without the port 114 for performing a single-sided sensing function. Furthermore, each of the ports 112 and 114 may be over-molded into the sensor device 700, or may be pluggable into the sensor device 700. Still further, each of the ports 112 and 114, independently, may be formed as part of the molding compound 124 rather than a separate piece.

FIGS. 8A-8B illustrate cross-sectional views of a sensor device 800, constructed according to aspects of the present disclosure. Similar to the sensor device 600, the sensor device 800 also includes the substrates 102 and 104, the media channel 105, the sensor chip 110, the optional signal processing chip 116, the port 112 and the optional port 114, the contact pads 120, the pins 134, and the molding compound 124. In an embodiment of the sensor device 800, the substrate 102 comprises a PCB, and the substrate 104 comprises a plastic material or a metallic material such as copper or copper alloy. In an alternative embodiment, each of the substrates 102 and 104 comprises a PCB. The substrate 102 is disposed over the substrate 104. The substrates 102 and 104 may be designed to have the same size or different sizes. The devices 116 and 110 are disposed over the substrate 102. The devices 116 and 110 may be electrically connected to the substrate 102 using bond wires 118, direct soldering (not shown), or other suitable mechanisms. For the purposes of simplicity, many aspects of the sensor device 800 are omitted in the following discussion.

Still referring to FIGS. 8A-8B, the media channel 105 includes a horizontal section 106 and two vertical sections 107 and 108. The horizontal section 106 is formed between a substantially flat portion of the top surface 104' and a recessed portion of the bottom surface 102". The vertical sections 107 and 108 are formed as holes through the substrate 102. The recessed portion of the bottom surface 102" and the vertical sections 107 and 108 may be formed by one or more drilling processes when the substrate 102 is manufactured. For example, the recessed portion of the bottom surface 102" may be formed as a milled slot, while the vertical sections 107 and 108 may be formed as through-holes in the PCB substrate 102. The recessed portion of the bottom surface 102" and the vertical sections 107 and 108 may be covered by copper, plated copper, copper alloy, plated copper alloy, or other suitable material for the purposes of sealing the media channel 105. The surfaces of the media channel 105 may be properly treated with a corrosion resistant material based on the application media, as discussed above.

The sensor device 800 may include both the ports 112 and 114 for performing a differential sensing function. Alternatively, the sensor device 800 may include the port 112 without the port 114 for performing a single-sided sensing function. Furthermore, each of the ports 112 and 114 may be over-molded into the sensor device 800, or may be pluggable into the sensor device 800. Still further, each of the ports 112 and 114, independently, may be formed as part of the molding compound 124 rather than a separate piece.

Figure 9:
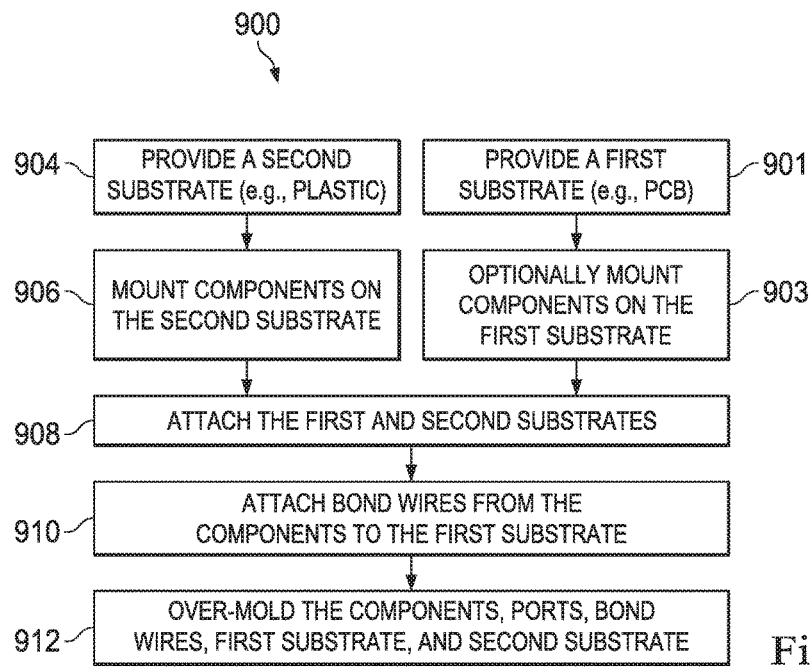
FIG. 9 shows a flow chart of an example method of making a sensor device, in accordance with an embodiment.

FIG. 9 illustrates a flow chart of a method 900 of forming a sensor device, such as the sensor devices 100, 300, 400, and 500. The method 900 is merely an example, and is not intended to limit the present disclosure beyond what is explicitly recited in the claims. The method 900 includes operations 901, 903, 904, 906, 908, 910, and 912. Additional operations can be provided before, during, and after the method 900, and some operations described can be replaced, eliminated, or moved around for additional embodiments of the method. The method 900 is briefly described below in conjunction with FIGS. 1A-5B.

At operation 901, the method 900 provides (or is provided with) a first substrate, such as the substrate 102. In the present embodiment, the first substrate 102 comprises a PCB. The top surface of the first substrate 102 includes bonding contacts 130 and a channel surface pad 132 (e.g., FIG. 1E or FIG. 1H). The bottom surface of the first substrate 102 includes conductive pads 120 (e.g., FIG. 1A). The top surface of the first substrate 102 may be substantially flat (e.g., FIG. 1A), or is provided with a recess (e.g., FIG. 3A or FIG. 4A).

At operation 903, the method 900 may mount some active or passive components on the top surface of the first substrate 102. This step may be omitted in some embodiments of the method 900.

At operation 904, the method 900 provides (or is provided with) a second substrate, such as the substrate 104. In the present embodiment, the second substrate 104 comprises a plastic material or a metallic material. In an alternative embodiment, the second substrate 104 comprises a PCB. The second substrate 104 is provided with two through-holes (or two channel holes) 107 and 108 as two vertical sections of the media channel 105. The bottom surface of the second substrate 104 may be provided with a recess (e.g., FIG. 1A or FIG. 3A), or be substantially flat (e.g., FIG. 4A). The top surface of the second substrate 104 may be provided with die attachment areas 126 and 128 (e.g., FIG. 1C or FIG. 1F). In an embodiment, the top surface of the second substrate 104 may also be provided with through holes 122 (e.g., FIGS. 5A-5B).

At operation 906, the method 900 mounts (or attaches) various components onto the top surface of the second substrate. For example, the method 900 may attach a sensor chip 110 and a signal processing chip 116 onto the die attachment areas 126 and 128 on the top surface of the second substrate 104 using adhesive, epoxy, tape, or the like. Particularly, the sensor chip 110 is attached directly above the vertical section 108. The method 900 may attach additional passive or active electronic components on the top surface of the second substrate 104. The method 900 may also attach one or both of the ports 112 and 114. Particularly, if needed, the port 112 is attached directly above the vertical section 107 and the port 114 is attached directly above the sensor chip 110. Alternatively, the method 900 may not attach any of the ports 112 and 114, but rely on the over-mold process to form the recesses 113 and/or 115 (e.g., FIG. 2B).

At operation 908, the method 900 attaches the first and second substrates using adhesive, epoxy, tape, or the like. At least one of the top surface of the first substrate 102 and the bottom surface of the second substrate 104 includes a recess (e.g., FIG. 1A, 3A, or 4A), which forms a horizontal section 106 of the media channel 105.

At operation 910, the method 900 attaches bond wires (e.g., bond wires 118) from the electronic components on the top surface of the second substrate 104 to bonding contacts 130 on the top surface of the first substrate 102. The bond wires 118 may comprise aluminum, copper, gold, gold plated copper, or other suitable material. The bond wires 118 may be attached to the electronic components and the bonding contacts using soldering. In an embodiment, the bond wires 118 are routed outside of the substrate 104 (e.g., FIGS. 1A-1B). In another embodiment, the bond wires 118 go through the holes 122 in the substrate 104 (e.g., FIGS. 5A-5B).

At operation 912, the method 900 over-molds the first substrate, the second substrate, the various electronic components, the bond wires, and the optional ports with a molding compound 124. The molding compound 124 may be a plastic, an epoxy, a silica-filled resin, a ceramic, a combination thereof, or other suitable material. The molding compound 124 may be applied as a liquid polymer, which is then cured with heat, pressure, ultraviolet radiation, ambient atmosphere, or other suitable mechanisms to form a solid compound.

Figure 10:
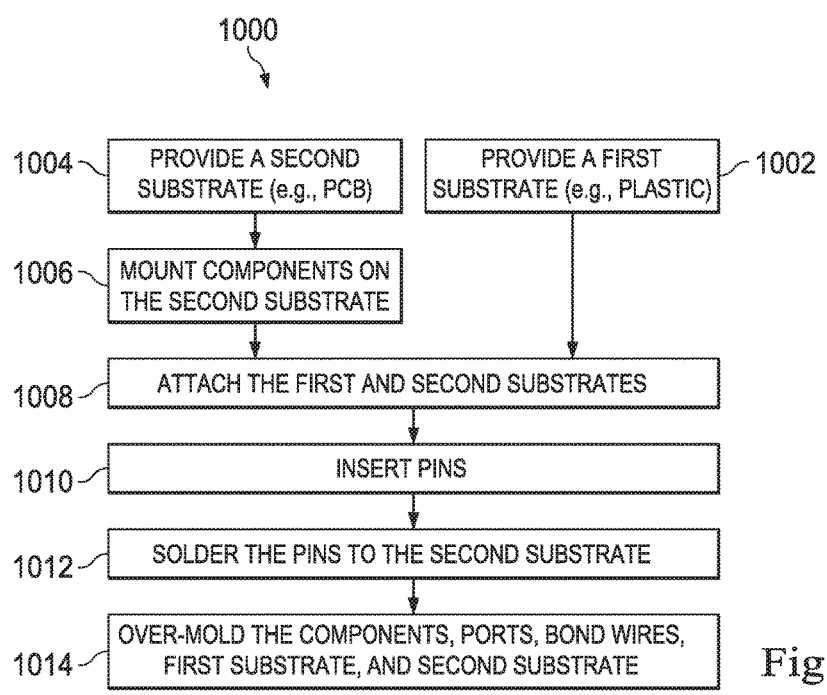
FIG. 10 shows a flow chart of another example method of making a sensor device, in accordance with an embodiment.

FIG. 10 illustrates a flow chart of a method 1000 of forming a sensor device, such as the sensor devices 600, 700, and 800. The method 1000 is merely an example, and is not intended to limit the present disclosure beyond what is explicitly recited in the claims. The method 1000 includes operations 1002, 1004, 1006, 1008, 1010, 1012, and 1014. Additional operations can be provided before, during, and after the method 1000, and some operations described can be replaced, eliminated, or moved around for additional embodiments of the method. The method 1000 is briefly described below in conjunction with FIGS. 6A-8B.

At operation 1002, the method 1000 provides (or is provided with) a first substrate, such as the substrate 104. In the present embodiment, the first substrate 104 comprises a plastic material or a metallic material. In an alternative embodiment, the first substrate 104 comprises a PCB. The top surface of the first substrate 104 may be provided with a recess (e.g., FIG. 6A or FIG. 7A), or be substantially flat (e.g., FIG. 8A). The first substrate 104 is provided with through-holes 122 (FIG. 6E).

At operation 1004, the method 1000 provides (or is provided with) a second substrate, such as the substrate 102. In the present embodiment, the second substrate 102 comprises a PCB. The top surface of the second substrate 102 includes bonding contacts 130 (e.g., FIG. 6C). The bottom surface of the second substrate 102 may include a channel surface pad 132 (e.g., FIG. 6D). The bottom surface of the second substrate 102 may be substantially flat (e.g., FIG. 6A), or is provided with a recess (e.g., FIG. 7A or FIG. 8A). The second substrate 102 is provided with two through-holes (or two channel holes) 107 and 108 as the two vertical sections of the media channel 105. The second substrate 102 further includes through-holes 122 for receiving the pins 134. In an embodiment, the holes 122 are surrounded by soldering sites 136 at the top surface of the second substrate 102 (e.g., FIG. 6C). Some of the soldering sites 136 are connected to the bonding contacts 130 through conductive traces 138 (e.g., FIG. 6C).

At operation 1006, the method 1000 mounts (or attaches) various components onto the top surface of the second substrate. For example, the method 1000 may attach a sensor chip 110 and a signal processing chip 116 onto the top surface of the second substrate 102 using adhesive, epoxy, tape, or the like. Particularly, the sensor chip 110 is attached directly above the vertical section 108. The method 1000 may attach additional passive or active electronic components on the top surface of the second substrate 102. The method 1000 also makes electrical connections between the electronic components and the PCB substrate 102 or among the electronic components. The electrical connections may be in the form of bond wires 118 or direct soldering in various embodiments. The method 1000 may also attach one or both of the ports 112 and 114. Particularly, if needed, the port 112 is attached directly above the vertical section 107 and the port 114 is attached directly above the sensor chip 110.

At operation 1008, the method 1000 attaches the first and second substrates using adhesive, epoxy, tape, or the like. Particularly, the holes 122 in the two substrates are aligned. At least one of the top surface of the first substrate 104 and the bottom surface of the second substrate 102 includes a recess (e.g., FIG. 6A, 7A, or 8A), which forms a horizontal section 106 of the media channel 105.

At operation 1010, the method 1000 inserts pins 134 into both substrates 102 and 104 through the holes 122. End portions of the pins 134 may become the contact pads 120. The pins 134 may be formed by stamping or etching a metal. In an alternative embodiment, the operation 1008 may be performed after the operation 1010. In other words, the pins 134 may be inserted into the first substrate 104 before the two substrates 104 and 102 are attached. In that case, the pins 134 function as an alignment mechanism in addition to making electrical connections.

At operation 1012, the method 1000 solders the pins 134 onto the top surface of the second substrate 102. For example, the pins 134 may be soldered onto the soldering sites 136 (FIG. 6C) located at the top surface of the second substrate 102. The pins 134 provide additional mechanical strength to the sensor device in addition to making electrical connections therein.

At operation 1014, the method 1000 over-molds the first substrate, the second substrate, the various electronic components, the bond wires, and the optional ports with a molding compound 124. The molding compound 124 may be a plastic, an epoxy, a silica-filled resin, a ceramic, a combination thereof, or other suitable material. The molding compound 124 may be applied as a liquid polymer, which is then cured with heat, pressure, ultraviolet radiation, ambient atmosphere, or other suitable mechanisms to form a solid compound.

Although not intended to be limiting, one or more embodiments of the present disclosure provide many benefits to sensor devices and the manufacturing processes thereof. For example, sensor devices according to some embodiments of the present disclosure include a molding compound covering and in mechanical contact with top and bottom substrates, a sensor chip, a signal processing chip, various other active and passive components, and bond wires. A media channel is provided between the top and bottom substrates with its surfaces properly sealed and treated for the application media. The molding compound not only protects the various components, but also increases the mechanical strength of the sensor device. In another embodiment, a sensor device is provided with metal pins that connect both substrates, which further increases the mechanical strength of the sensor device. Sensor devices according to the present disclosure can be made into a very compact package.

In one exemplary aspect, the present disclosure is directed to a sensor device. The sensor device includes a first substrate having a bottom surface and a top surface and a second substrate having a bottom surface and a top surface. The bottom surface of the second substrate is disposed on the top surface of the first substrate. The sensor device further includes a media channel having two vertical sections and a horizontal section. The two vertical sections are through the second substrate. A portion of the bottom surface of the second substrate forms a top surface of the horizontal section, and a portion of the top surface of the first substrate forms a bottom surface of the horizontal section. The sensor device further includes a sensor chip disposed on the top surface of the second substrate and on one of the two vertical sections of the media channel. The sensor device further includes a molding compound covering side surfaces of the first substrate, the second substrate, and the sensor chip.

In another exemplary aspect, the present disclosure is directed to a method for packaging of sensor device. The method is performed with respect to a first substrate comprising a printed circuit board (PCB) and a second substrate comprising a plastic material, a metallic material, or another PCB. The second substrate has a media channel with a horizontal section at a bottom surface of the second substrate and two vertical sections through the second substrate. The method includes mounting a sensor chip onto the top surface of the second substrate directly on one of the two vertical sections of the media channel. The method further includes attaching the first and second substrates with the bottom surface of the second substrate facing the first substrate. The method further includes bonding one or more wires from the sensor chip to one or more contact pads on the first substrate. The method further includes over-molding the first substrate, the second substrate, the sensor chip, and the one or more wires.

In yet another exemplary aspect, the present disclosure is directed to a method for making a sensor device. The method is performed with respect to a first substrate comprising a plastic material, a metallic material, or a printed circuit board (PCB), and a second substrate comprising another PCB. The first substrate has first holes and a recess at a top surface of the first substrate. The second substrate has second holes and two media channel holes. The method includes mounting a sensor chip onto the top surface of the second substrate directly on one of the two media channel holes. The method further includes attaching the first and second substrates with a bottom surface of the second substrate facing the top surface of the first substrate and the first holes being aligned with the second holes. The method further includes inserting pins through the first and second holes, wherein the recess at the top surface of the first substrate and the two media channel holes form a continuous media channel. The method further includes soldering the pins to the top surface of the second substrate and over-molding the first substrate, the second substrate, the signal processing chip, and the sensor chip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A sensor device, comprising:
   a first substrate having a bottom surface and a top surface;
   a second substrate having a bottom surface and a top surface, wherein the bottom surface of the second substrate is disposed on the top surface of the first substrate;
   a media channel having two vertical sections and a horizontal section, wherein the two vertical sections are through the second substrate, a portion of the bottom surface of the second substrate forms a top surface of the horizontal section, and a portion of the top surface of the first substrate forms a bottom surface of the horizontal section;
   a sensor chip disposed on the top surface of the second substrate and on one of the two vertical sections of the media channel;
   a molding compound covering side surfaces of the first substrate, the second substrate, and the sensor chip; and
   a port disposed on the top surface of the second substrate and directly on the other one of the two vertical sections of the media channel such that the port allows an application media to propagate through the port and the media channel to reach a sensing area of the sensor chip.

2. The sensor device of claim 1, further comprising:
   another port disposed directly on the sensor chip.

3. The sensor device of claim 1, wherein the first substrate comprises a printed circuit board (PCB) and the second substrate comprises a plastic material, a metallic material, or another PCB.

4. The sensor device of claim 3, further comprising:
   one or more bond wires electrically connecting the first substrate to the sensor chip.

5. The sensor device of claim 4, further comprising:
   one or more contact pads on the bottom surface of the first substrate, the one or more contact pads electrically connecting to the sensor chip.

6. The sensor device of claim 3, wherein the bottom surface of the horizontal section of the media channel comprises copper or gold.

7. The sensor device of claim 3, wherein the horizontal section of the media channel comprises a recess in the second substrate.

8. The sensor device of claim 3, wherein the horizontal section of the media channel comprises a recess in the first substrate.

9. The sensor device of claim 1, wherein the first substrate comprises a plastic material, a metallic material, or a PCB, and the second substrate comprises another PCB.

10. The sensor device of claim 9, wherein the top surface of the second substrate includes contact pads, further comprising:
    one or more bond wires electrically connecting the sensor chip to the contact pads, wherein the molding compound covers the one or more bond wires.

11. The sensor device of claim 9, wherein the sensor chip is soldered onto the top surface of the second substrate.

12. The sensor device of claim 9, wherein the horizontal section of the media channel comprises a recess in the first substrate.

13. The sensor device of claim 9, wherein the horizontal section of the media channel comprises a recess in the second substrate.

14. The sensor device of claim 1, wherein the port is formed as part of the molding compound.

15. A sensor device, comprising:
 a first substrate having a bottom surface and a top surface;
 a second substrate having a bottom surface and a top surface, wherein the bottom surface of the second substrate is disposed over the top surface of the first substrate, wherein the first and second substrates have different materials and at least one of the first and second substrates includes a printed circuit board (PCB);
 a media channel having two vertical sections and a horizontal section, wherein the two vertical sections are through the second substrate, the horizontal section is between the first and second substrates;
 a sensor chip disposed over the top surface of the second substrate and directly above one of the two vertical sections of the media channel;
 a molding compound covering at least side surfaces of the first substrate, the second substrate, and the sensor chip; and
 a port disposed on the top surface of the second substrate and directly on the other one of the two vertical sections of the media channel such that the port allows an application media to propagate through the port and the media channel to reach a sensing area of the sensor chip.

16. The sensor device of claim 15, wherein the top surface of the first substrate is substantially flat, the bottom surface of the second substrate has a recessed portion, and the horizontal section is defined by the recessed portion.

17. The sensor device of claim 15, wherein the first substrate includes a PCB and the second substrate includes a plastic material.

18. A sensor device, comprising:
 a first substrate having a bottom surface and a substantially flat top surface;
 a second substrate having a bottom surface and a top surface, wherein the bottom surface of the second substrate has a horizontal channel and is disposed over the top surface of the first substrate, the second substrate includes two vertical channels that connect the horizontal channel to the top surface of the second substrate, wherein the first and second substrates have different materials and at least one of the first and second substrates includes a printed circuit board (PCB);
 a sensor chip disposed over the top surface of the second substrate and directly above one of the two vertical channels;
 a molding compound covering at least side surfaces of the first substrate, the second substrate, and the sensor chip; and
 a port disposed on the top surface of the second substrate and directly on the other one of the two vertical channels such that the port allows an application media to propagate through the port, the other one of the two vertical channels, and the horizontal channel to reach a sensing area of the sensor chip.

19. The sensor device of claim 18, further comprising:
 contact pads on the bottom surface of the first substrate; and
 conductive elements connecting the contact pads to the sensor chip.

* * * * *